United States Patent
Matsuno

(10) Patent No.: US 7,642,879 B2
(45) Date of Patent: *Jan. 5, 2010

(54) IMPEDANCE MATCHING APPARATUS

(75) Inventor: Daisuke Matsuno, Osaka (JP)

(73) Assignee: Daihen Corporation, Osaka (JP)

( * ) Notice: Subject to any disclaimer, the term of this patent is extended or adjusted under 35 U.S.C. 154(b) by 152 days.

This patent is subject to a terminal disclaimer.

(21) Appl. No.: 12/004,010

(22) Filed: Dec. 19, 2007

(65) Prior Publication Data
US 2008/0129407 A1 Jun. 5, 2008

Related U.S. Application Data

(60) Continuation of application No. 11/701,003, filed on Feb. 1, 2007, now Pat. No. 7,332,981, which is a division of application No. 11/263,636, filed on Oct. 31, 2005, now Pat. No. 7,199,678.

(30) Foreign Application Priority Data

Nov. 9, 2004 (JP) ............................. 2004-324531
Sep. 30, 2005 (JP) ............................. 2005-286882

(51) Int. Cl.
*H03H 7/38* (2006.01)

(52) U.S. Cl. ..................................... 333/17.3; 324/684

(58) Field of Classification Search ................. 333/17.3, 333/32; 324/684
See application file for complete search history.

(56) References Cited

U.S. PATENT DOCUMENTS

| 6,291,999 | B1 | 9/2001 | Nishimori et al. |
| 6,535,785 | B2 | 3/2003 | Johnson et al. |
| 6,580,278 | B1 | 6/2003 | Harrison |
| 7,199,678 | B2 * | 4/2007 | Matsuno .................... 333/17.3 |
| 7,332,981 | B2 * | 2/2008 | Matsuno .................... 333/17.3 |
| 2003/0184319 | A1 | 10/2003 | Nishimori et al. |

FOREIGN PATENT DOCUMENTS

JP          5-63604          3/1993

* cited by examiner

*Primary Examiner*—Stephen E Jones
(74) *Attorney, Agent, or Firm*—Hamre, Schumann, Mueller & Larson, P.C.

(57) ABSTRACT

An impedance matching apparatus 3 calculates a forward wave voltage Vfo and a reflected wave voltage Vro at an output terminal 3b, based on a forward wave voltage Vfi and a reflected wave voltage Vri at an input terminal 3a, on information on variable values of variable capacitors VC1, VC2 acquired in advance through measurement, and on a T parameter of the impedance matching apparatus 3 corresponding to the information on the variable values of variable capacitors VC1, VC2. The impedance matching apparatus 3 calculates an input reflection coefficient Γi at the input terminal 3a corresponding to the information on the variable values of the variable capacitors VC1, VC2, based on the forward wave voltage Vfo, the reflected wave voltage Vro and the T parameter. The impedance matching apparatus 3 selects the lowest absolute value out of absolute values |Γi| of the input reflection coefficients corresponding to the variable values of the variable capacitors VC1, VC2, and adjusts the impedance of the variable capacitors VC1, VC2 based on the lowest value.

4 Claims, 10 Drawing Sheets

IMPEDANCE MATCHING APPARATUS

This application is a continuation of U.S. Ser. No. 11/701,003, filed on Feb. 1, 2007 which is a division of U.S. Ser. No. 11/263,636, filed Oct. 31, 2005, which application is incorporated herein by reference.

BACKGROUND OF THE INVENTION

1. Field of the Invention

The present invention relates to an impedance matching apparatus to be interposed between a high-frequency power source and a load, for matching the impedance of the high-frequency power source and the impedance of the load.

2. Description of the Related Art

Manufacturing process of semiconductors or flat panel displays includes a plasma process. Some of plasma process chambers to be employed in the plasma process require to be applied to high-frequency voltage with a radio frequency band, for example, from 100 kHz to 300 MHz.

Between the high-frequency power source and the plasma process chamber acting as the load, an impedance matching apparatus is interposed. The impedance matching apparatus serves to match the impedance of the high-frequency power source and that of the plasma process chamber i.e. the load, to minimize the reflected power from the load to the high-frequency power source, thus maximizing the power supply to the load.

FIG. 10 depicts a configuration of a high-frequency power supply system including an impedance matching apparatus, disclosed in JP-A H05-63604. The impedance matching apparatus according to the cited document, has an input terminal connected to a high-frequency power source 41, and an output terminal connected to a load 42. The impedance matching apparatus includes a matching circuit 43 including an input-side detector 44, inductors L2, L3 and variable capacitors VC3, VC4 serving as impedance variable devices.

The input-side detector 44 detects a high-frequency voltage V and a high-frequency current I with a radio frequency band, and a phase difference θ between the high-frequency voltage V and the high-frequency current I. The detected high-frequency voltage V, high-frequency current I and the phase difference θ there between are input to a computer 46 via an A/D converter 45 separately provided from the impedance matching circuit 43.

The computer 46 calculates an input impedance Zi of the impedance matching circuit 43, i.e. the impedance Zi present in the impedance matching circuit 43 in a direction from the input terminal 43a toward the load 42, based on the results detected by the input-side detector 44 (i.e. high-frequency voltage V, high-frequency current I, phase difference θ).

Each of the variable capacitors VC3, VC4 includes an adjustment unit (not shown) to change the capacitance of the variable capacitor VC3 and VC4, respectively, controlled by a motor M when a control signal output from the computer 46 is input to the driving voltage supplier 47 so as to drive the motor M. The computer 46 detects the adjustment positions of the variable capacitors VC3, VC4, to thereby calculate the impedances Zc3, Zc4 of the variable capacitors VC3, VC4 serving as the impedance variable devices.

The computer 46 calculates a load circuit-side impedance Zo at the output terminal 43b of the impedance matching circuit 43 in a direction toward the load 42, based on the input impedance Zi and the impedances Zc3, Zc4 of the impedance variable devices.

The computer 46 varies the adjustment positions of the variable capacitors VC3, VC4 so that the input impedance Zi matches with the output impedance Zp (for instance, 50Ω) on the side of the high-frequency power source 41 based on the calculated load circuit-side impedance Zo, thus matching the impedance of the high-frequency power source 41 and that of the load 42.

The impedance matching circuit 43 according to the cited document acquires the load circuit-side impedance Zo based on the input impedance Zi calculated from the high-frequency voltage V, the high-frequency current I, and the phase difference θ therebetween detected by the input-side detector 44, and on the impedances Zc3, Zc4 of the variable capacitors VC3, VC4 detected by the computer 46 with regard to the adjustment positions of the variable capacitors VC3, VC4, and then determines the adjustment positions of the variable capacitors VC3, VC4 to be matched.

When handling a high-frequency wave, however, the circuit devices serving as the matching circuit of the impedance matching circuit 43 include not only the variable capacitors VC3, VC4 and the inductors L2, L3, but also stray capacitance components between those parts and the housing and inductance components of copper plates or waveguides connecting those parts, and influences such impedance components is unable to disregard on the impedance matching performance.

The impedance controlling method according to the cited document employs the impedance matching circuit 43 consisting only of the variable capacitors VC3, VC4 and the inductors L2, L3, so as to determine matching characteristics of the matching circuit at the current adjustment positions, based on the impedance-values Zc3, Zc4 of the variable capacitors VC3, VC4 at the current adjustment positions, and on impedance values Zl3, Zl4 of the inductors L2, L3. Accordingly, from a strict viewpoint, the impedance components such as the stray capacitance are not counted in the matching circuit, and hence the matching circuit is not designed to perform in consideration of the impedance components such as the stray capacitance. As a result, the matching circuit according to the cited document fails to perform with sufficient accuracy, especially in a high-frequency region.

Also, the impedance components such as the stray capacitance readily change depending on the shape of the housing around the impedance matching circuit 43, or on the positional relation inside the impedance matching circuit 43 of the parts such as the variable capacitors VC3, VC4, the inductors L2, L3, and the other parts, and the wirings. Therefore, the matching circuits including the impedance components such as the stray capacitance may have different characteristics depending on the internal structure of the matching apparatus, even though the matching circuits are constituted of the same variable capacitors VC3, VC4 and the inductors L2, L3, and hence may suffer from the problem of unequal matching accuracy among the apparatuses.

SUMMARY OF THE INVENTION

The present invention has been conceived in view of such situation, with an object to solve the foregoing problems.

A first aspect of the present invention provides an impedance matching apparatus to be interposed between a high-frequency power source and a load, for changing an impedance of an impedance variable device so as to match an impedance of the high-frequency power source and an impedance of the load, comprising: a high-frequency wave information detector to detect information on a forward wave advancing from the high-frequency power source toward the load and information on a reflected wave advancing from the load toward the high-frequency power source, at an input terminal of the impedance matching apparatus; a variable device information detector to detect information on a variable value of the impedance variable device; a first storage unit to store therein a characteristic parameter of the impedance matching apparatus acquired through a preceding measurement, with respect to the information on a variable value of a plurality of the impedance variable devices, in correlation with the information on the variable value of the impedance variable device; a first calculator to calculate the information on the forward wave and the information on the reflected wave at an output terminal of the impedance matching apparatus, based on the information on the variable value of the impedance variable device detected by the variable device information detector, on the characteristic parameter stored in the first storage unit, and on the information on the forward wave and the information on the reflected wave detected by the high-frequency wave information detector; a second calculator to calculate an input reflection coefficient at the input terminal of the impedance matching apparatus with respect to the information on the variable value of a plurality of the impedance variable devices, based on the information on the forward wave and the information on the reflected wave at the output terminal of the impedance matching apparatus calculated by the first calculator and on a plurality of the characteristic parameters stored in the first storage unit; a second storage unit to store therein a plurality of input reflection coefficients calculated by the second calculator in correlation with the information on the variable value of the impedance variable device; a first identifier to select an input reflection coefficient closest to a predetermined target input reflection coefficient out of the plurality of input reflection coefficients stored in the second storage unit, and to identify the information on the variable value of the impedance variable device corresponding to the selected input reflection coefficient; and an adjustment unit to adjust an impedance of the impedance variable device, based on the information on the variable value of the impedance variable device identified by the first identifier.

Preferably, the second calculator may calculate the information on the forward wave and the information on the reflected wave at the input terminal of the impedance matching apparatus with respect to the information on the variable value of a plurality of the impedance variable devices, based on the information on the forward wave and the information on the reflected wave at the output terminal of the impedance matching apparatus calculated by the first calculator and on the plurality of characteristic parameters stored in the first storage unit, and may calculate the input reflection coefficient with respect to the information on the variable value of the plurality of impedance variable devices, based on the calculated information on the forward wave and the information on the reflected wave at the input terminal of the impedance matching apparatus.

Preferably, the impedance matching apparatus may further comprise a setting unit to set the target input reflection coefficient.

Preferably, the characteristic parameter may be an S parameter, or a T parameter acquired through conversion from the S parameter.

A second aspect of the present invention provides an impedance matching apparatus to be interposed between a high-frequency power source and a load, for changing an impedance of an impedance variable device so as to match an impedance of the high-frequency power source and an impedance of the load, comprising: a high-frequency wave information detector to detect information on a forward wave advancing from the high-frequency power source toward the load and information on a reflected wave advancing from the load toward the high-frequency power source, at an input terminal of the impedance matching apparatus; a variable device information detector to detect information on a variable value of the impedance variable device; a first storage unit to store therein a characteristic parameter of the impedance matching apparatus acquired through a preceding measurement, with respect to the information on the variable value of a plurality of the impedance variable devices, in correlation with the information on the variable value of the impedance variable device; a first calculator to calculate the information on the forward wave and the information on the reflected wave at an output terminal of the impedance matching apparatus, based on the information on the variable value of the impedance variable device detected by the variable device information detector, on the characteristic parameter stored in the first storage unit, and on the information on the forward wave and the information on the reflected wave detected by the high-frequency wave information detector; a third calculator to calculate a reflection coefficient at the output terminal of the impedance matching apparatus, based on the information on the forward wave and the information on the reflected wave at the output terminal of the impedance matching apparatus calculated by the first calculator; a fourth calculator to calculate a reflection coefficient at the output terminal of the impedance matching apparatus with respect to the information on the variable value of the plurality of impedance variable devices, based on a predetermined target input reflection coefficient and a plurality of the characteristic parameters stored in the first storage unit; a third storage unit to store therein a plurality of the reflection coefficients calculated by the fourth calculator in correlation with the information on the variable value of the impedance variable device; a second identifier to select a reflection coefficient closest to the reflection coefficient at the output terminal of the impedance matching apparatus calculated by the third calculator out of the plurality of reflection coefficients stored in the third storage unit, and to identify the information on the variable value of the impedance variable device corresponding to the selected reflection coefficient; and an adjustment unit to adjust an impedance of the impedance variable device, based on the information on the variable value of the impedance variable device identified by the second identifier.

Preferably, the impedance matching apparatus may further comprise a setting unit to set the target input reflection coefficient.

Preferably, the characteristic parameter may be an S parameter, or a T parameter acquired through conversion from the S parameter.

Other features and benefits of the present invention will become more apparent from the description on exemplary embodiments given here below.

DETAILED DESCRIPTION OF PREFERRED EMBODIMENTS

Hereunder, embodiments of the present invention will be described in details, referring to the accompanying drawings.

Figure 1:
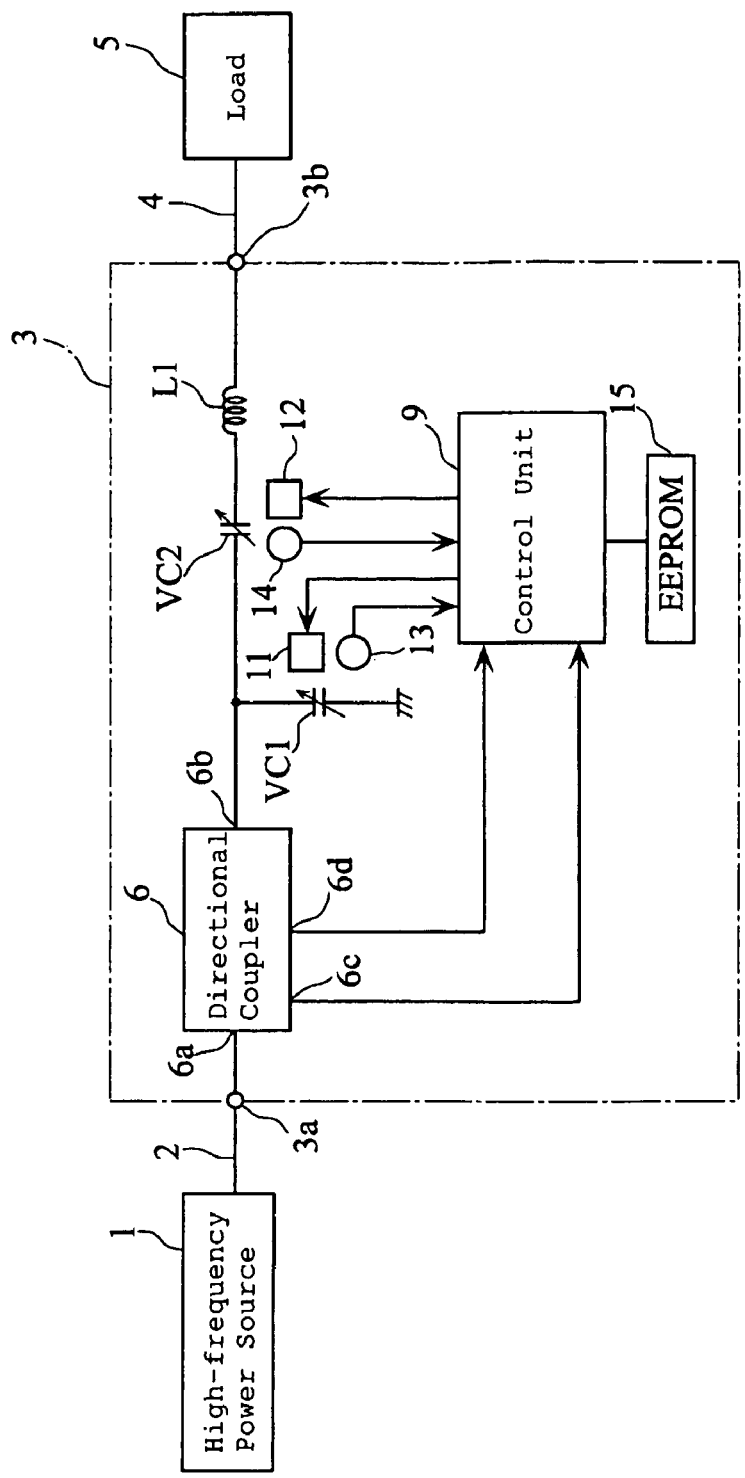
FIG. 1 is a block diagram showing a configuration of a high-frequency power supply system including an impedance matching apparatus according to the first embodiment of the present invention, and a circuit diagram of the impedance matching apparatus.

FIG. 1 is a block diagram showing a configuration of a high-frequency power supply system including an impedance matching apparatus according to the first embodiment of the present invention, and a circuit diagram of the impedance matching apparatus.

The high-frequency power supply system supplies a high-frequency wave to an object to be processed such as a semiconductor wafer or a liquid crystal substrate, to thereby perform a processing such as plasma etching. The high-frequency power supply system includes a high-frequency power source 1, a transmission line 2, an impedance matching apparatus 3, a load connector 4 and a load 5 including a plasma processing apparatus (plasma process chamber).

The high-frequency power source 1 supplies a high-frequency power with a predetermined frequency (for instance, 13.56 MHz or 200 MHz) to the load 5. The high-frequency power source 1 is connected to the impedance matching apparatus 3 via the transmission line 2, which is for example a coaxial cable. The impedance matching apparatus 3 is connected to the load connector 4 including for example a shielded copper plate that serves to suppress leakage of electromagnetic waves, and the load connector 4 is connected to the load 5.

The load 5 is a plasma processing apparatus that performs an etching or a CVD for processing a semiconductor wafer or a liquid crystal substrate. The plasma processing apparatus performs various types of works depending on the processing purpose of the object. When performing an etching on the object for example, the plasma processing apparatus appropriately determines the type of gas, the gas pressure, the amount to be supplied, and the supplying time of the high-frequency power, depending on the etching process to be performed. In the plasma processing apparatus, the gas to be used for plasma discharge is introduced into a container (not shown) in which the object is placed, and plasma discharge is performed with the gas thus to turn the gas condition from a non-plasma state into a plasma state. And then, the gas in the plasma state is utilized for processing the object.

The impedance matching apparatus 3 serves to match the impedance of the high-frequency power source 1 connected to the input terminal 3a thereof and the impedance of the load 5 connected to the output terminal 3b thereof. To be more detailed, for example, when the impedance in a direction from the input terminal 3a toward the high-frequency power source 1 (output impedance) is designed to be 50Ω and the high-frequency power source 1 is connected to the input terminal of the impedance matching apparatus 3 via the transmission line 2 having a characteristic impedance of 50Ω, the impedance matching apparatus 3 automatically adjusts the impedance in a direction from the input terminal 3a of the impedance matching apparatus 3 toward the load 5 to be as close as possible to 50Ω. It is to be noted that although the characteristic impedance is specified as 50Ω in this embodiment, the characteristic impedance is not limited to 50Ω.

The impedance matching apparatus 3 includes a directional coupler 6, a control unit 9, an inductor L1, and variable capacitors VC1, VC2 serving as impedance variable devices. The inductor L1 and the variable capacitors VC1, VC2 constitute a matching circuit.

The directional coupler 6 separately detects a high-frequency wave advancing from the high-frequency power source 1 toward the load 5 (hereinafter, "forward wave") and a high-frequency wave reflected from the load 5 (hereinafter, "reflected wave"). The directional coupler 6 includes, for example, an input port 6a and three output ports 6b, 6c, 6d, and the input port 6a is connected to the high-frequency power source 1 while the first output port 6b is connected to the variable capacitors VC1, VC2. The second output port 6c and the third output port 6d are connected to the control unit 9. The directional coupler 6 works as a part of the high-frequency wave information detect or according to the present invention.

The forward wave input through the input port 6a is output through the first output port 6b, and the reflected wave input through the first output port 6b is output through the input port 6a. The forward wave is attenuated to an appropriate level to be detected, and is output through the second output port 6c. The reflected wave is attenuated to an appropriate level to be detected, and output through the third output port 6d.

Here, an input-side detector may be employed instead of the directional coupler 6. The input-side detector serves to detect, for example, a high-frequency voltage and a high-frequency current input to the input terminal 3a from the high-frequency power source 1, and a phase difference therebetween. The high-frequency voltage, the high-frequency current and the phase difference detected by the input-side detector are input to the control unit 9.

The control unit 9 acts as the control center of the impedance matching apparatus 3, and includes a CPU, RAM, ROM and so forth though not shown. The control unit 9 changes the capacitances C1, C2 of the variable capacitors VC1, VC2 based on outputs of the directional coupler 6, so as to control the automatic matching operation of the impedance matching apparatus 3.

The control unit 9 outputs control signals to the variable capacitors VC1, VC2, to achieve impedance matching between the high-frequency power source 1 and the load 5. The variable capacitors VC1, VC2 change the areas of their pairs of facing electrodes (not shown) based on the control signals from the control unit 9, to thereby vary the capacitances C1, C2 of the variable capacitors VC1, VC2. Specifically, the variable capacitors VC1, VC2 respectively include adjustment units 11, 12 that change the capacitances C1, C2.

Each of the adjustment units 11, 12 includes a stepping motor for driving the pair of facing electrodes and a motor driving circuit, (neither shown). The control unit 9 controls the rotation amounts of the stepping motors thus to change the capacitances C1, C2 of the variable capacitors VC1, VC2. In this embodiment, the capacitances C1, C2 of the variable capacitors VC1, VC2 are set to be variable in a thousand steps. The adjustment units 11, 12 serve as adjusting means in the present invention.

The variable capacitors VC1, VC2 respectively include position detectors 13, 14 that detect adjustment positions changed by the adjustment units 11, 12. Position information of the variable capacitors VC1, VC2 detected by the position detectors 13, 14 is input to the control unit 9, to be recognized by the control unit 9.

The position detectors 13, 14 serve as detecting means in the present invention for information about the variable devices. Also, the information on the variable values of the impedance variable devices according to the present invention refers to the information that enables to identify the variable value of the impedance variable devices such as the variable capacitors VC1, VC2.

Though the position information of the stepping motors is employed as the variable values of the impedance variable devices in this embodiment, the variable values of the impedance variable devices does not have to be limited to employ it, and with motors of different types such as servomotors, they may employ the position information of such motors. Also, the position information may be represented by numbers of steps of stepping motors, or by other indices such as numbers of pulses or voltages. Thus, it is adequate to employ such information that allows directly or indirectly to specify the variable values of the impedance variable devices.

The control unit 9 is connected to an EEPROM 15. In the EEPROM 15, scattering parameter (hereinafter, "S parameter") data of the impedance matching apparatus 3 at each of the adjustment positions of the variable capacitors VC1, VC2 are stored. The S parameter data at each of the adjustment positions of the variable capacitors VC1, VC2 are measured for example in the factory in advance of the shipment of the products. Such data may be stored in a non-volatile memory such as a flash memory, instead of in the EEPROM 15. The EEPROM 15 serves as the first storage unit in the present invention.

It is to be noted that S parameters represent, as are generally known, transmission characteristics in a predetermined 4-terminal circuit network obtained when a high-frequency signal is input to an input terminal and an output terminal of the 4-terminal circuit network connected to a line having a characteristic impedance (for instance, 50Ω). More specifically, S parameters are input-side voltage reflection coefficient ($S_{11}$), forward voltage transmission coefficient ($S_{21}$), reverse voltage transmission coefficient ($S_{12}$), and output-side voltage reflection coefficient ($S_{22}$), constituting a matrix as indicated by Formula 1 given below. In this embodiment, the impedance matching apparatus 3 is regarded as the 4-terminal circuit network, for calculating S parameters of the impedance matching apparatus 3.

$$\begin{bmatrix} S_{11} & S_{12} \\ S_{21} & S_{22} \end{bmatrix} \quad (1)$$

Figure 2:
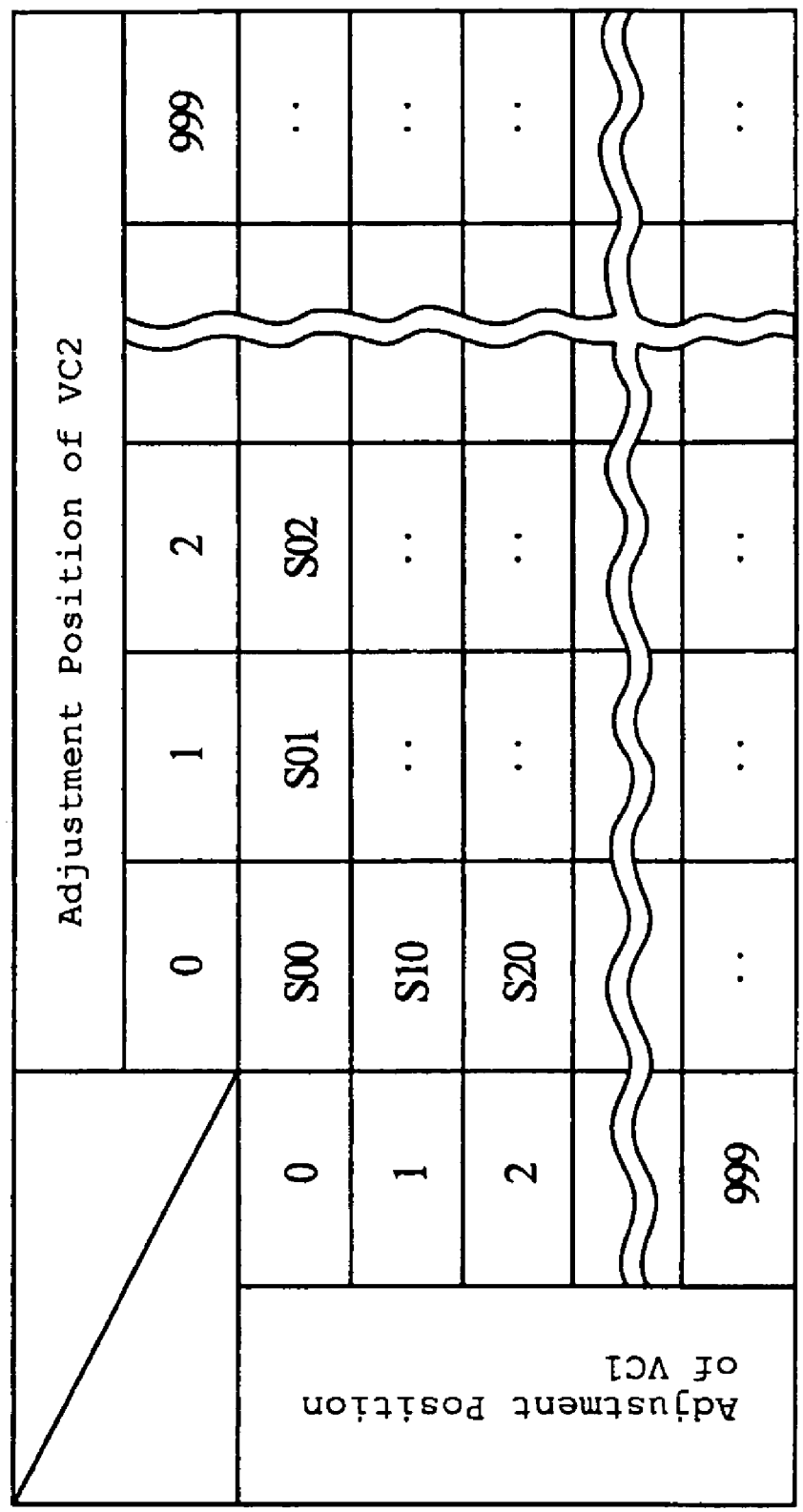
FIG. 2 is a table showing S parameter data corresponding to adjustment positions of variable capacitors stored in the EEPROM.

As shown in FIG. 2, in the EEPROM 15 a set of S parameters is stored with respect to every adjustment positions of the variable capacitors VC1, VC2. According to FIG. 2, a set of S parameters are represented by [SXY(X=0, 1, . . . , 999, Y=0, 1, . . . 999)], such that, for example, when the adjustment position of the variable capacitor VC1 is "0" and the adjustment position of the variable capacitor VC2 is "0", the set of S parameters is expressed as "S00".

The data of the set "S00" include, as shown by Formula 1, such parameters as the input-side voltage reflection coefficient ($S_{11}$), the forward voltage transmission coefficient ($S_{21}$), the reverse voltage transmission coefficient ($S_{12}$), and the output-side voltage reflection coefficient ($S_{22}$). The parameter sets with respect to every adjustment positions of the variable capacitors VC1, VC2 have unique values.

The control unit 9 calculates a voltage Vfo of the forward wave and a voltage Vro of the reflected wave at the output terminal 3$b$ of the impedance matching apparatus 3, based on the transmission parameters (hereinafter, T parameters) computed through conversion from the S parameters stored in the EEPROM 15 and on outputs of the directional coupler 6 (more specifically, vector information computed through conversion at a vectorization unit 21 to be described later).

The control unit 9 calculates the absolute values |Γi| of the input reflection coefficients Γi at the input terminal 3$a$ with respect to all of the combinations of the adjustment positions of the variable capacitors VC1, VC2, based on the forward wave voltage Vfo and the reflected wave voltage Vro at the output terminal 3$b$. The control unit 9 selects the smallest absolute value |Γi| of the input reflection coefficient Γi from all of the absolute values |Γi| of the input reflection coefficients Γi, and determines which adjustment positions of the variable capacitors VC1, VC2 should be adopted based on the smallest absolute value |Γi| of the input reflection coefficient Γi. Details of such controlling process will be subsequently described.

Figure 3:
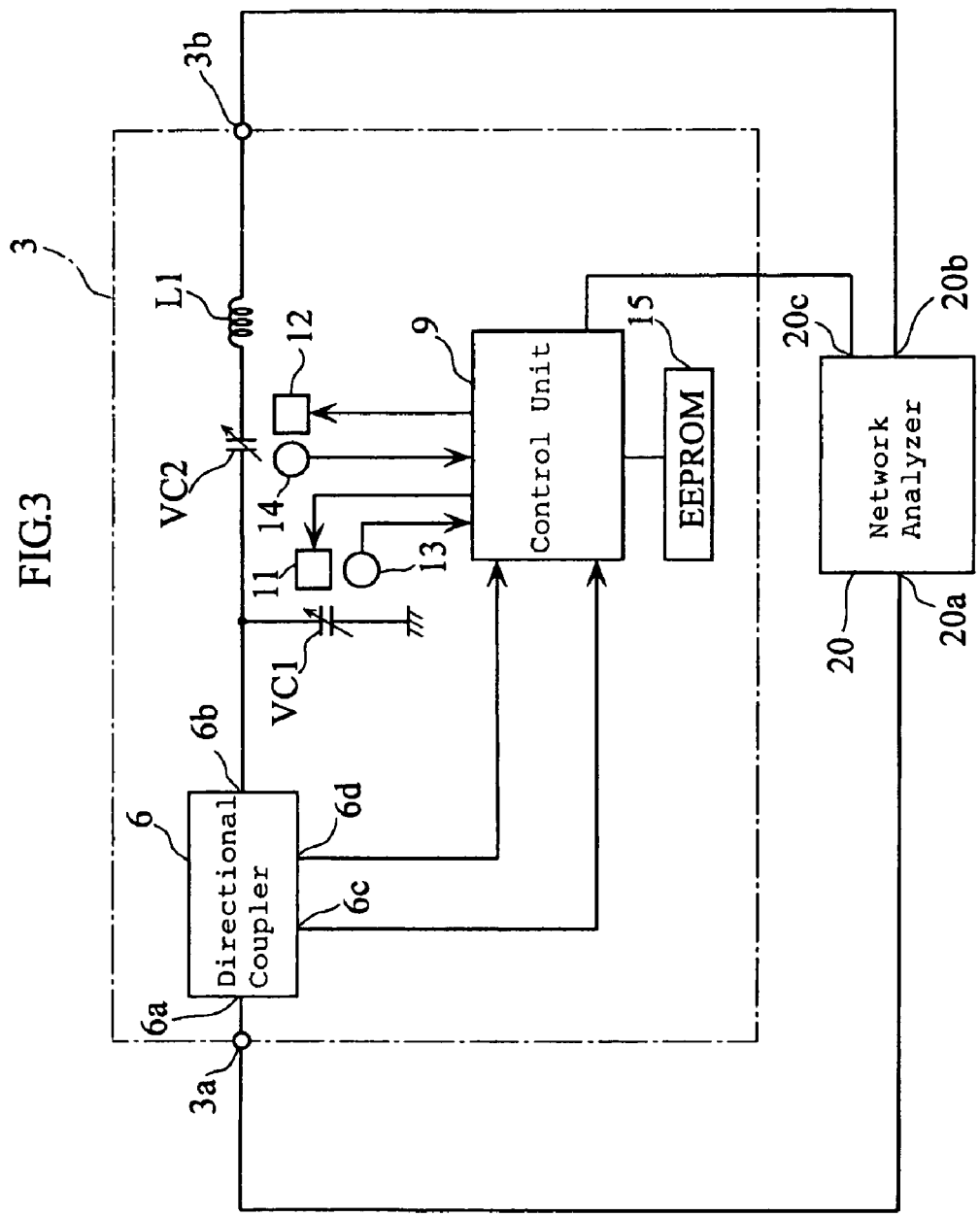
FIG. 3 is a block diagram showing a configuration for measuring S parameters of the impedance matching apparatus.

FIG. 3 is a block diagram showing a configuration of a measuring circuit for acquiring S parameter data of the impedance matching apparatus 3. The measuring circuit is assembled, for example in a factory, in advance of the shipment of the products.

According to FIG. 3, S parameter data of the impedance matching apparatus 3 are acquired for example through a network analyzer 20 having an input/output (hereinafter, I/O) impedance of 50Ω. More specifically, the first I/O terminal 20$a$ of the network analyzer 20 is connected to the input terminal 3$a$ of the impedance matching apparatus 3, and the second I/O terminal 20$b$ of the network analyzer 20 is connected to the output terminal 3$b$ of the impedance matching apparatus 3. Likewise, a control terminal 20$c$ of the network analyzer 20 is connected to the control unit 9 of the impedance matching apparatus 3.

The measuring circuit thus configured acquires S parameter data as follows.

As already stated, the variable capacitors VC1, VC2 are adjustable in multiple steps, and S parameters of the impedance matching apparatus 3 are acquired with respect to each single step of the adjustment positions of the variable capacitors VC1, VC2, by the network analyzer 20.

To be more detailed, firstly the control unit 9 sets the adjustment positions of the variable capacitors VC1, VC2 at (0, 0), for instance. Then a high-frequency wave (for instance, 13.56 MHz or 200 MHz) is input to the input terminal 3$a$ of the impedance matching apparatus 3, from the first I/O terminal 20$a$ of the network analyzer 20. Here, the frequency of the high-frequency wave is the frequency of the high-frequency power supplied by the high-frequency power source 1 to the load 5, in the high-frequency power supply system.

The high-frequency wave output from the network analyzer 20 (i.e. incident wave) is partially reflected at the input terminal 3$a$ of the impedance matching apparatus 3, and is input to the network analyzer 20 through the first I/O terminal 20$a$. (Hereinafter, the reflected part is referred to as "reflected wave".) The rest of the incident wave is transmitted through the impedance matching apparatus 3, and is output through the output terminal 3b, and then is input to the network analyzer 20 through the second I/O terminal 20b. (Hereinafter, the transmitted part is referred to as "transmitted wave".)

The reflected wave and the transmitted wave are respectively detected inside the network analyzer 20, so that the input-side voltage reflection coefficient ($S_{11}$) and the forward voltage transmission coefficient ($S_{21}$) constituting a part of the set of S parameters are measured based on the incident wave, the reflected wave and the transmitted wave. Specifically, when the incident wave, the reflected wave, and the transmitted wave are denoted by a1, b1, and b2 respectively, the voltage reflection coefficient ($S_{11}$) and the forward voltage transmission coefficient ($S_{21}$) can be measured through calculation of $S_{11}=b1/a1$ and $S_{21}=b2/a1$.

Then a high-frequency wave having the same frequency is input to the output terminal 3b of the impedance matching apparatus 3 from the second I/O terminal 20b of the network analyzer 20. The high-frequency wave output from the network analyzer 20 (i.e. incident wave) is partially reflected at the output terminal 3b of the impedance matching apparatus 3, and is input to the network analyzer 20 through the second I/O terminal 20b. The rest of the incident wave is transmitted through the impedance matching apparatus 3, and is output through the input terminal 3a, and then is input to the network analyzer 20 through the first I/O terminal 20a.

The reflected wave and the transmitted wave are respectively detected inside the network analyzer 20, so that the reverse voltage transmission coefficient ($S_{12}$) and the output-side voltage reflection coefficient ($S_{22}$) constituting a part of the set of S parameters are measured based on the incident wave, the reflected wave, and the transmitted wave. Specifically, when the incident wave, the reflected wave, and the transmitted wave are denoted by a2, b2, and b1 respectively, the voltage reflection coefficient ($S_{12}$) and the reverse voltage transmission coefficient ($S_{22}$) can be measured through calculation of $S_{12}=b1/a2$ and $S_{22}=b2/a2$.

Thereafter, the control unit 9 changes the adjustment positions of the variable capacitors VC1, VC2 in an increment of each single step, and the S parameters with respect to the respective changed adjustment positions are similarly measured.

The network analyzer 20 then outputs a plural of data sets, respectively including an adjustment position of the variable capacitor VC1, an adjustment position of the variable capacitor VC2, and a set of S parameters, to the control unit 9. The control unit 9 sequentially stores the data sets in the EEPROM 15. Accordingly, the EEPROM 15 clarifies correspondence between the adjustment positions of the variable capacitors VC1, VC2 and the S parameters on storing, as shown in FIG. 2.

Here, together with the set of S parameters, the capacitances C1, C2 of the variable capacitors VC1, VC2 may be stored in the EEPROM 15 instead of the position information of the stepping motors to change the capacitances C1, C2 of the variable capacitors VC1, VC2. When employing servo motors in place of the stepping motors, the EEPROM 15 may clarify correspondence between the position information of the servo motors and the S parameters on storing.

The number of the data sets thus acquired by the measuring circuit equals the number of the combinations throughout the entire adjustable range of the impedance variable devices, i.e. the variable capacitors VC1, VC2 provided in the impedance matching apparatus 3. In this embodiment, since the variable capacitors VC1, VC2 are adjustable in one thousand steps, a million sets (1000×1000 sets) of data sets are acquired. When the measurement is performed with respect to two or more frequencies, a million sets of data sets are acquired with respect to each frequency.

The S parameter data may be output to a monitor (not shown) of the network analyzer 20, to a display unit or a printer (none shown) provided separately from the impedance matching apparatus 3. Naturally, the data may be output to various external apparatuses (not shown) capable of displaying wave shapes based on analog signals or to an external information processing apparatus (not shown) through serial communication.

Once the S parameters of the impedance matching apparatus 3 has been thus acquired, the impedance matching apparatus 3 may be shipped from the factory, and incorporated in a high-frequency power supply system at a local site in a configuration as shown in FIG. 1, thus to be put to practical use.

Figure 4:
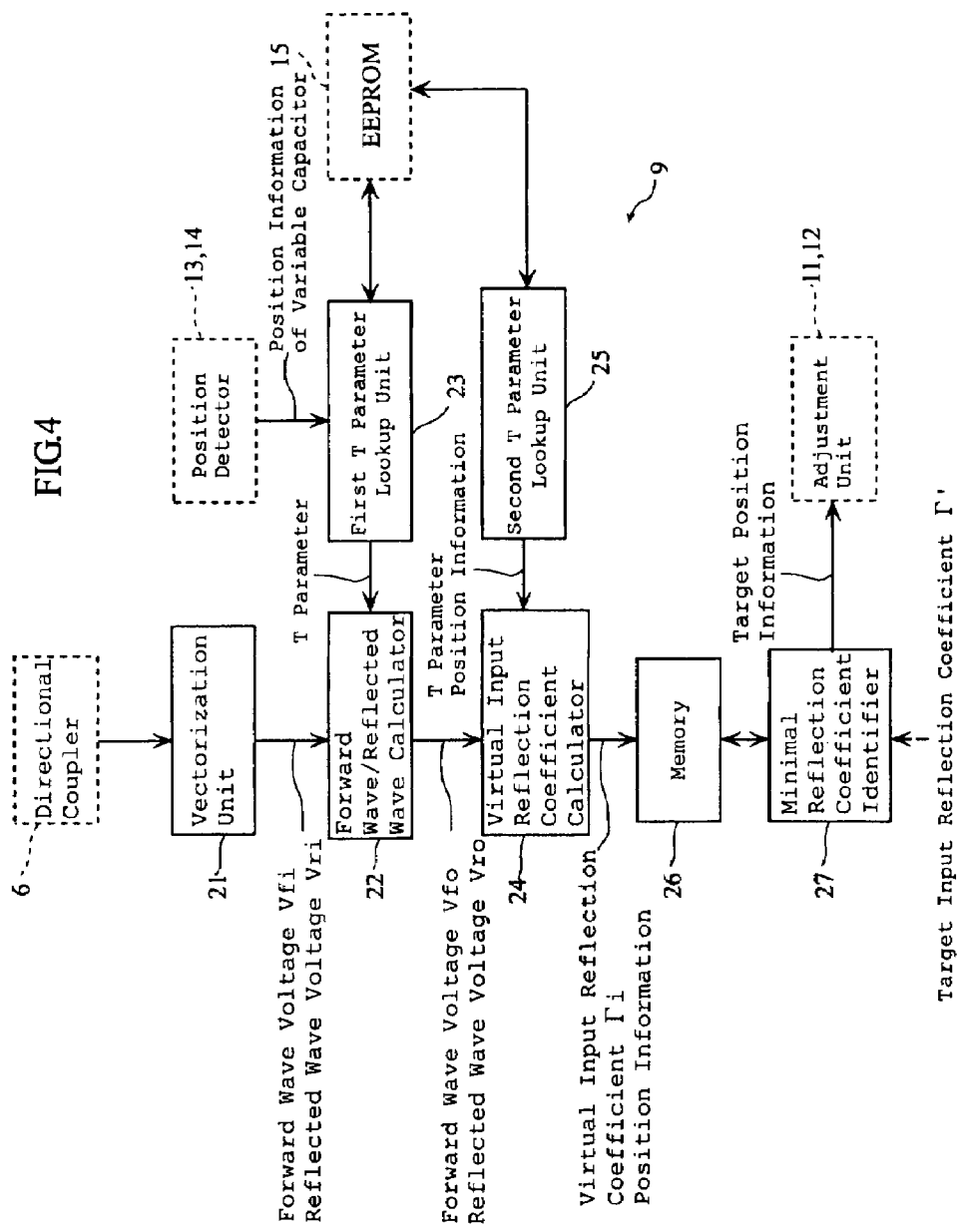
FIG. 4 is a block diagram showing functional blocks of the control unit.
Figure 5:
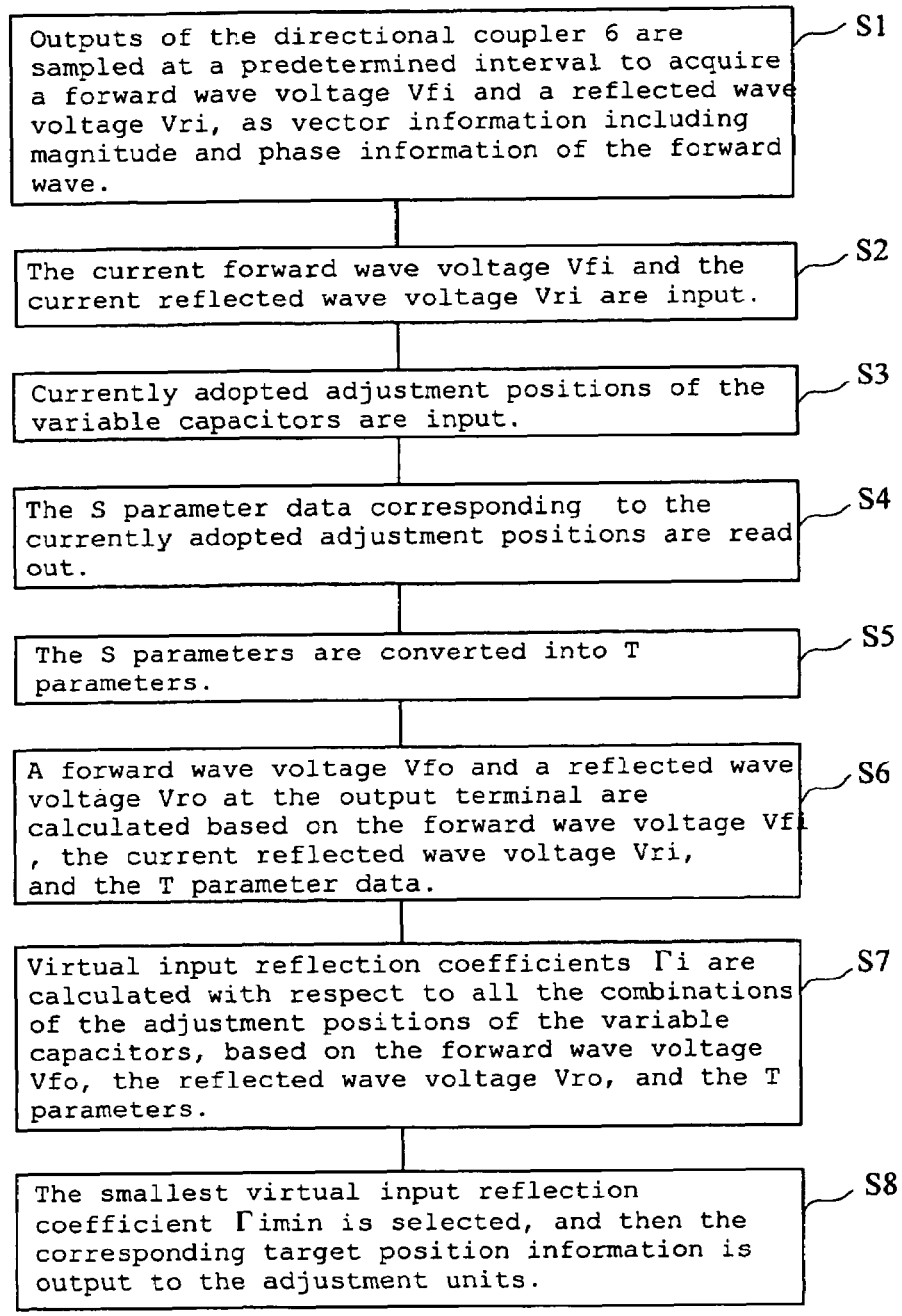
FIG. 5 is a flowchart showing an operating process of the impedance matching apparatus.

Referring now to FIG. 4 showing functional blocks of the control unit 9 and to FIG. 5 showing a flowchart, description will be given on an operation of the impedance matching apparatus 3 under practical use with a high-frequency power supply system. The control unit 9 includes, from the viewpoint of functions, a vectorization unit 21, a forward wave/reflected wave calculator 22, a first T parameter lookup unit 23, a virtual input reflection coefficient calculator 24, a second T parameter lookup unit 25, a memory 26, and a minimal reflection coefficient identifier 27, as shown in FIG. 4.

The section including the forward wave/reflected wave calculator 22 and the first T parameter lookup unit 23 serves as the first calculator according to the present invention. The section including the virtual input reflection coefficient calculator 24 and the second T parameter lookup unit 25 serves as the second calculator. The reflection coefficient identifier 27 serves as the first identifier. The memory 26 serves as the second storage unit. Also, the vectorization unit 21 constitutes a part of the high-frequency wave information detector. Here, as stated earlier, the directional coupler 6 also constitutes a part of the high-frequency wave information detector according to the present invention. In other words, a section including the directional coupler 6 and the vectorization unit 21 serves as the high-frequency wave information detector.

When the high-frequency power source 1 supplies the high-frequency wave, the directional coupler 6 separately detects the forward wave and the reflected wave, and outputs the results to the vectorization unit 21. The vectorization unit 21 receives the output of the directional coupler 6, and performs sampling of the input signal at a predetermined interval, to thereby acquire a forward wave voltage Vfi and a reflected wave voltage Vri, as vector information including magnitude and phase information of the forward wave (step S1).

It should be noted that the impedance matching apparatus according to this embodiment includes an A/D converter (not shown) to convert the outputs of the directional coupler 6 into digital information. When employing an input-side detector in place of the directional coupler 6 also, an A/D converter (not shown) is provided to convert the outputs of the input-side detector into digital information. Thus, the forward wave voltage Vfi and the reflected wave voltage Vri can be obtained by a known method, based on the information input from the input-side detector.

When the current forward wave voltage Vfi and the current reflected wave voltage Vri are output from the vectorization unit 21, they are input to the forward wave/reflected wave calculator 22 (step S2).

Meanwhile, the position detectors 13, 14 for the variable capacitors VC1, VC2 detect currently adopted adjustment positions of the variable capacitors VC1, VC2, and such position information is input to the first T parameter lookup unit 23 (step S3).

The first T parameter lookup unit 23 reads out the S parameter data stored corresponding to the above-mentioned position information (i.e. the currently adopted adjustment positions), from all of the S parameter data stored in the EEPROM 15 (Ref. FIG. 2) corresponding to all of the combinations of the adjustment positions of the variable capacitors VC1, VC2, based on the current position information of the variable capacitors VC1, VC2 (step S4). The first T parameter lookup unit 23 converts the read out set of S parameters into a set of T parameters (step S5), and the prepared set of T parameters is output to the forward wave/reflected wave calculator 22.

A set of T parameters can be prepared through conversion from a set of S parameters using the matrix shown as Formula 2, and hence the first T parameter lookup unit 23 performs calculation according to Formula 2. In a four-terminal circuit network, in general, it is simpler to utilize S parameters when measuring transmission characteristics, while it is simpler to utilize T parameters when performing calculation. Accordingly, in this embodiment, S parameters are converted into T parameters, which are more convenient for calculation.

$$\frac{1}{S_{12}}\begin{bmatrix} S_{12}S_{21} - S_{11}S_{22} & S_{22} \\ -S_{11} & 1 \end{bmatrix} \rightarrow \begin{bmatrix} T_{11} & T_{12} \\ T_{21} & T_{22} \end{bmatrix} \quad (2)$$

Alternatively, T parameters may be prepared when the S parameters of the impedance matching apparatus 3 is measured before the shipment of the product, and then stored in the EEPROM 15 in advance of operation. In this case, the first T parameter lookup unit 23 reads out the set of T parameters corresponding to the adjustment positions of the variable capacitors VC1, VC2 stored in the EEPROM 15, based on the current position information of the variable capacitors VC1, VC2, and outputs the read out set of T parameters to the forward wave/reflected wave calculator 22.

Also, instead of the process performed by the first T parameter lookup unit 23, the conversion from S parameters to T parameters may be first performed, so as to select the set of T parameters corresponding to the current position information (i.e. currently adopted adjustment positions) from all the set of the prepared T parameters, to thereby output the selected set of T parameters.

The forward wave/reflected wave calculator 22 calculates a forward wave voltage Vfo and a reflected wave voltage Vro at the output terminal 3b, based on the current forward wave voltage Vfi and the current reflected wave voltage Vri at the input terminal 3a input thereto at the step S2, as well as based on the T parameter data corresponding to the current adjustment positions of the variable capacitors VC1, VC2 (step S6).

In this case, Formula 3 given below is utilized for the calculation of the current forward wave voltage Vfo and the current reflected wave voltage Vro at the output terminal 3b. In addition, dividing the current reflected wave voltage Vro at the output terminal 3b by the forward wave voltage Vfo gives the load reflection coefficient ΓO.

$$\begin{pmatrix} V_{fo} \\ V_{ro} \end{pmatrix} = \begin{pmatrix} T'_{11} & T'_{12} \\ T'_{21} & T'_{22} \end{pmatrix} \begin{pmatrix} V_{fi} \\ V_{ri} \end{pmatrix} \quad (3)$$

$$V_{fo} = T'_{11}V_{fi} + T'_{12}V_{ri}$$

$$V_{fo} = T'_{21}V_{fi} + T'_{22}V_{ri}$$

Here, $T_{11}'$, $T_{21}'$, $T_{12}'$, and $T_{22}'$ are the T parameters constituting the set corresponding to the current adjustment positions of the variable capacitors VC1, VC2. The current forward wave voltage Vfo and the current reflected wave voltage Vro at the output terminal 3b are output to the virtual input reflection coefficient calculator 24.

Figure 6:
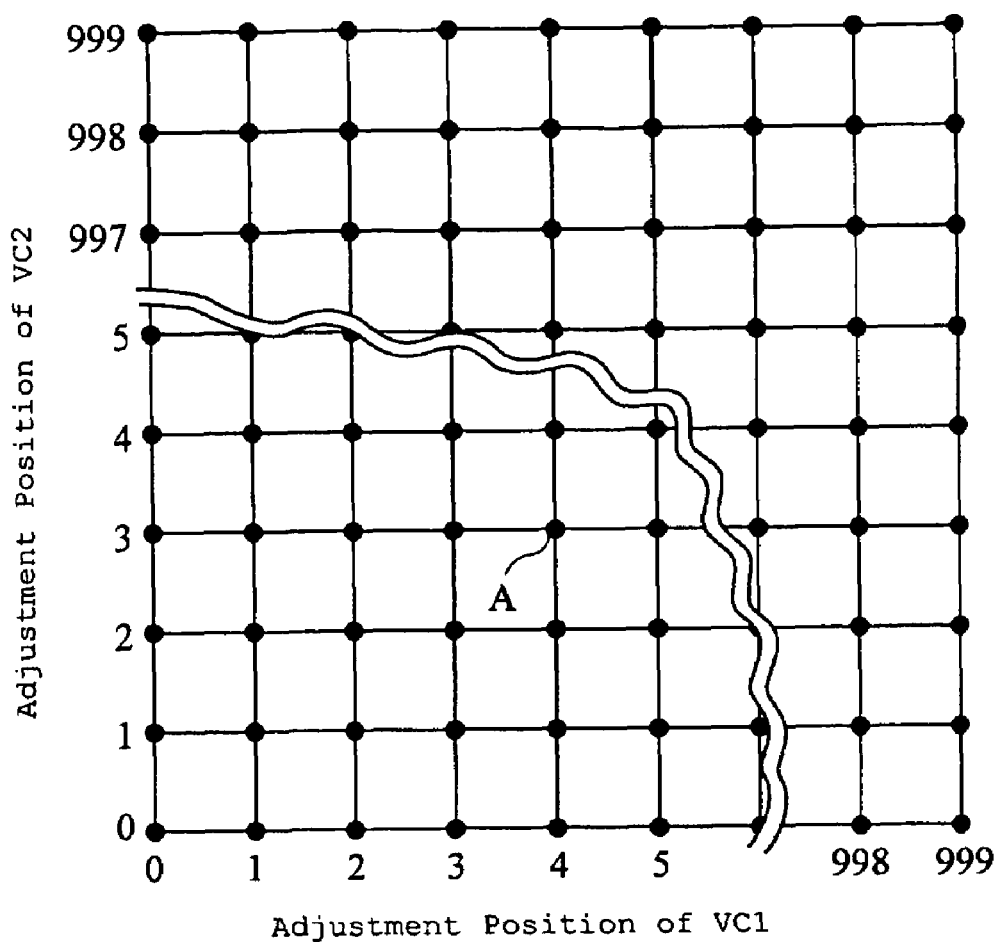
FIG. 6 is a diagram schematically showing combinations of the adjustment positions of the variable capacitors.

Meanwhile, the second T parameter lookup unit 25 reads out all the S parameter data stored in the EEPROM 15 with respect to all the combinations of the adjustment positions of the variable capacitors VC1, VC2 (Ref. FIG. 6), and converts each of the S parameter data into T parameters respectively. The prepared T parameters are output to the virtual input reflection coefficient calculator 24, together with the corresponding position information (i.e. the information on the combination of the adjustment positions) of the variable capacitors VC1, VC2.

Also, if the T parameters are to be output from the second T parameter lookup unit 25 in a predetermined sequence, and then the virtual input reflection coefficient calculator 24 is capable of identifying the correspondence between T parameters and the position information of the variable capacitors VC1, VC2, T parameters alone may be output without the position information of the variable capacitors VC1, VC2 corresponding to the T parameters.

Further, as already stated, if T parameters are preinstalled in the EEPROM 15, the second T parameter lookup unit 25 may read out the T parameter data corresponding to every combination of the adjustment positions of the variable capacitors VC1, VC2 from the EEPROM 15 together with the position information i.e. the information on the combination of the adjustment positions) of the variable capacitors VC1, VC2, and output such data to the virtual input reflection coefficient calculator 24.

Alternatively, the second T parameter lookup unit 25 may be omitted, and instead the virtual input reflection coefficient calculator 24 may be granted with a function of reading out the T parameter data corresponding to every combination of the adjustment positions of the variable capacitors VC1, VC2 from the EEPROM 15 together with the position information (i.e. the information on combination of the adjustment positions) of the variable capacitors VC1, VC2.

The virtual input reflection coefficient calculator 24 calculates virtual values of input reflection coefficients Γi (hereinafter, "virtual input reflection coefficient Γi") with respect to every combination of the adjustment positions of the variable capacitors VC1, VC2, based on the current forward wave voltage Vfo and the current reflected wave voltage Vro at the output terminal 3b (step S7).

Specifically, the matrix formula given below as Formula 4 is first utilized so as to calculate forward wave voltages Vfi' and reflected wave voltages Vri' at the input terminal 3a corresponding to the respective combinations of the adjustment positions of the variable capacitors VC1, VC2, based on the current forward wave voltage Vfo and the current reflected wave voltage Vro at the output terminal 3b and on the T parameters corresponding to the respective combinations (Ref. FIG. 6) of the adjustment positions of the variable capacitors VC1, VC2 output from the second T parameter lookup unit 25.

$$\begin{pmatrix} V'_{fi} \\ V'_{ri} \end{pmatrix} = \begin{pmatrix} T''_{11} & T''_{12} \\ T''_{21} & T''_{22} \end{pmatrix}^{-1} \begin{pmatrix} V_{fo} \\ V_{ro} \end{pmatrix} \quad (4)$$

Here, $T_{11}''$, $T_{21}''$, $T_{12}''$, and $T_{22}''$ are the T parameters constituting the set corresponding to the adjustment positions of the variable capacitors VC1, VC2. Accordingly, the virtual input reflection coefficient calculator 24 reversely calculates from the current forward wave voltage Vfo and the current reflected wave voltage Vro at the output terminal 3b into the forward wave voltage Vfi' and the reflected wave voltage Vri' at the input terminal 3a using the inversion matrix formula of the T parameters ($T_{11}"$, $T_{21}"$, $T_{12}"$, $T_{22}"$).

The virtual input reflection coefficient calculator 24 then divides the reflected wave voltage Vri' by the forward wave voltage Vfi', thus to obtain the virtual input reflection coefficient Γi as shown in Formula 5. The virtual input reflection coefficient Γi is worked out with respect to every combination of the adjustment positions of the variable capacitors VC1, VC2. The virtual input reflection coefficients Γi corresponding to all the combinations of the adjustment positions of the variable capacitors VC1, VC2 are sequentially transmitted to the memory 26 together with the corresponding position information of the variable capacitors VC1, VC2, to be temporarily stored in the memory 26.

$$\Gamma_i = \frac{V'_{ri}}{V'_{fi}} \quad (5)$$

Here, if the virtual input reflection coefficients Γi are to be output from the virtual input reflection coefficient calculator 24 in a predetermined sequence and then at the memory 26 is capable identification of the correspondence between the virtual input reflection coefficient Γi and the position information of the variable capacitors VC1, VC2, the virtual input reflection coefficient Γi alone may be output without the position information of the variable capacitors VC1, VC2 corresponding to the virtual input reflection coefficient Γi.

The minimal reflection coefficient identifier 27 selects the virtual input reflection coefficient having the smallest absolute value |Γimin| among the virtual input reflection coefficients Γi corresponding to all the combinations of the adjustment positions of the variable capacitors VC1, VC2, calculated by the virtual input reflection coefficient calculator 24 and stored in the memory 26, and then specifies as a target position the adjustment positions of the variable capacitors VC1, VC2 corresponding to the absolute value |Γimin| of the selected virtual input reflection coefficient. For example, when the smallest absolute value |Γimin| of the virtual input reflection coefficient is selected at the point A in FIG. 6, the adjustment position (4, 3) of the variable capacitors VC1, VC2 is identified as the target position.

In other words, when the variable capacitors VC1, VC2 are adjusted to take the position corresponding to the smallest absolute value |Γimin| of the virtual input reflection coefficient, the amount of the reflected wave at the input terminal 3a becomes minimal, and therefore the impedance can be appropriately matched.

In this embodiment, the minimal reflection coefficient identifier 27 selects the virtual input reflection coefficient having the lowest absolute value |Γimin| out of the virtual input reflection coefficients Γi corresponding to all the combinations of the adjustment positions of the variable capacitors VC1, VC2. This method is generally equivalent to selecting, when a desired input reflection coefficient (hereinafter, "target input reflection coefficient Γ'") is zero, a virtual input reflection coefficient Γi closest to the target input reflection coefficient Γ'. The reflection coefficient of zero means that both of the real part and the imaginary part of the reflection coefficient are zero, when the reflection coefficient is denoted by the sum of the real part and the imaginary part.

The target input reflection coefficient Γ' may be predetermined in a different number, without limitation to zero. In this case, an input reflection coefficient closest to such target input reflection coefficient Γ' may be selected, out of the virtual input reflection coefficients Γi corresponding to all the combinations of the adjustment positions of the variable capacitors VC1, VC2. Also, a setting unit that sets the target input reflection coefficient Γ' may be provided, so that the setting unit may change the target input reflection coefficient Γ' as desired.

For selecting the smallest absolute value |Γimin| of the virtual input reflection coefficient, the combinations of all the adjustment positions of the variable capacitors VC1, VC2 may be divided into a plurality of groups, and then select the smallest absolute value |Γimin| of the virtual input reflection coefficient, out of the virtual input reflection coefficients Γi corresponding to the combinations of the adjustment positions of the variable capacitors VC1, VC2 in a specific group, instead of selecting the smallest absolute value |Γimin| of the virtual input reflection coefficient out of the virtual input reflection coefficients Γi corresponding to all the combinations of the adjustment positions of the variable capacitors VC1, VC2.

In case that the smallest absolute value |Γimin| of the virtual input reflection coefficient selected out of the combinations of the adjustment positions of the variable capacitors VC1, VC2 in a specific group is not smaller than a predetermined threshold value, the smallest absolute value |Γimin| of the virtual input reflection coefficient may be selected out of the combinations of the adjustment positions of the variable capacitors VC1, VC2 in another group.

The target position information of the variable capacitors. VC1, VC2 selected by the minimal reflection coefficient identifier 27 is transmitted to the adjustment units 11, 12 (step S8), so that the variable capacitors VC1, VC2 are displaced to the specified positions by the stepping motors or the like. In other words, the variable capacitors VC1, VC2 are adjusted to take the positions that make the virtual input reflection coefficient Γi minimal.

The foregoing steps cause the capacitances C1, C2 of the variable capacitors VC1, VC2 to change, so as to match the impedance of the high-frequency power source 1 connected to the input terminal 3a of the impedance matching apparatus 3 and the impedance of the load 5 connected to the output terminal 3b of the impedance matching apparatus 3, thereby supplying a maximal amount of high-frequency power to the load 5.

As described above, according to this embodiment the entire of the impedance matching apparatus 3 is considered as a transmission apparatus, so as to acquire the transmission characteristics of the transmission apparatus in a form of information of S parameters and T parameters throughout the adjustable range of the variable capacitors VC1, VC2, to thereby perform the impedance matching with higher accuracy based on such information in comparison with the conventional impedance matching method.

To be more detailed, the S parameters and the T parameters represent the transmission characteristics of the whole matching circuit in the impedance matching apparatus 3 taking the components of the stray capacitances and the inductances into consideration. Accordingly, adjusting the capacitances C1, C2 of the variable capacitors VC1, VC2 to the value corresponding to the minimal virtual input reflection coefficient calculated based on the transmission characteristics allows performing the impedance matching with higher correctness and accuracy in comparison with the conventional impedance matching method.

The foregoing embodiment refers to the impedance matching performed by the impedance matching apparatus 3 that includes the matching circuit including the inductor L1 and the variable capacitors VC1, VC2, in which, when the conventional method is employed, the calculation method of the impedance has to be rearranged according to the circuit configuration when the matching circuit has a different configuration. In this embodiment, however, S parameters and T parameters are measured and calculated with respect to the entirety of the impedance matching apparatus 3, already affected by the configuration of the matching circuit. Therefore, there is no need to rearrange the calculation method for each different configuration.

Figure 7:
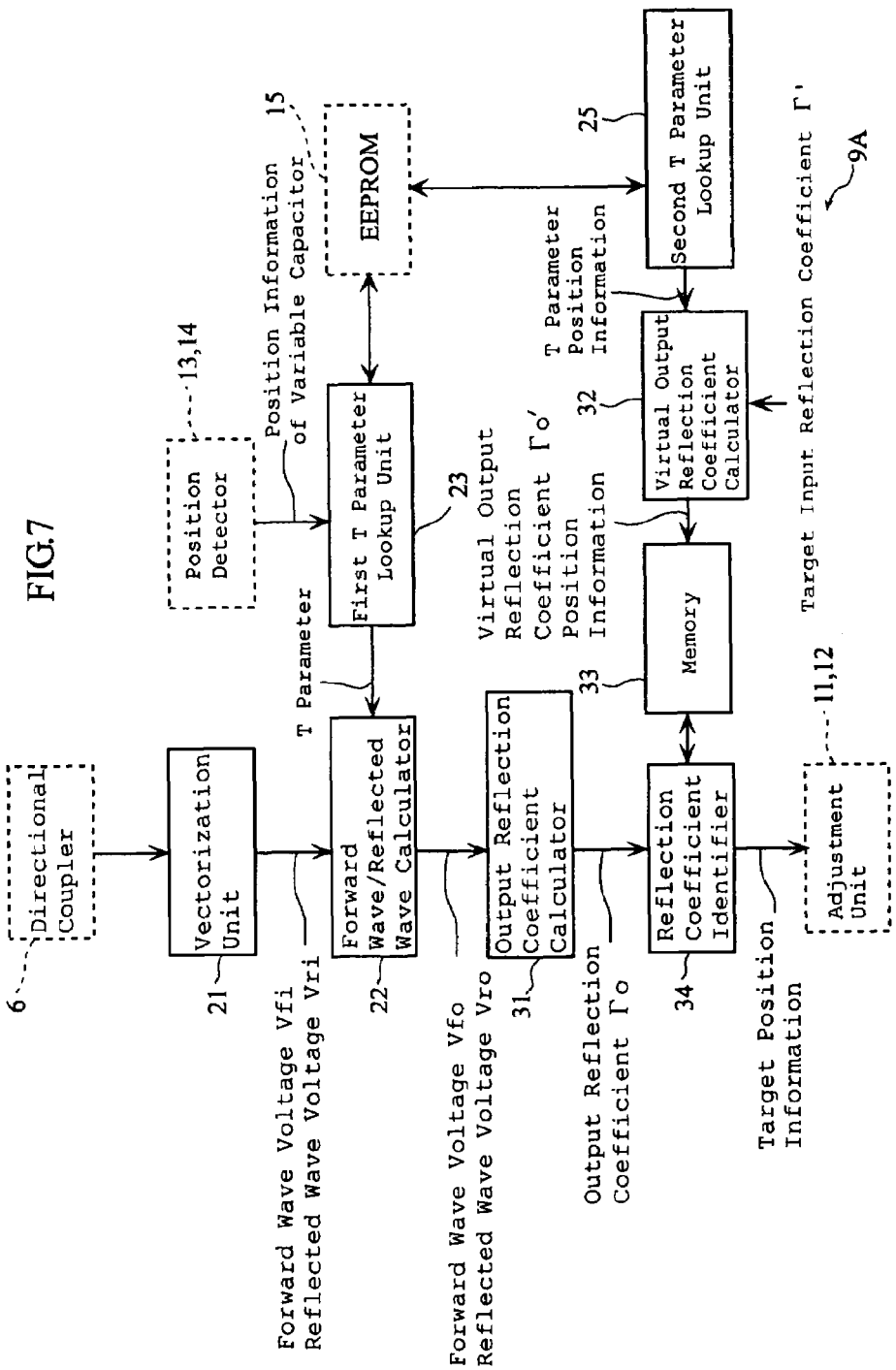
FIG. 7 is a block diagram showing functional blocks of the control unit of an impedance matching apparatus according to the second embodiment of the present invention.

FIG. 7 is a block diagram showing functional blocks of a control unit 9A of an impedance matching apparatus according to the second embodiment of the present invention. The impedance matching apparatus according to this embodiment is different from that of the first embodiment in setting a desired input reflection coefficient Γ' in advance, calculating virtual output reflection coefficients Γo' based on the desired input reflection coefficient Γ' and on the T parameter data corresponding to all the combinations of the adjustment positions of the variable capacitors VC1, VC2, selecting therefrom the virtual output reflection coefficient Γo" closest to the current output reflection coefficient Γo, and adjusting the impedance based on the selected virtual output reflection coefficient Γo".

Figure 8:
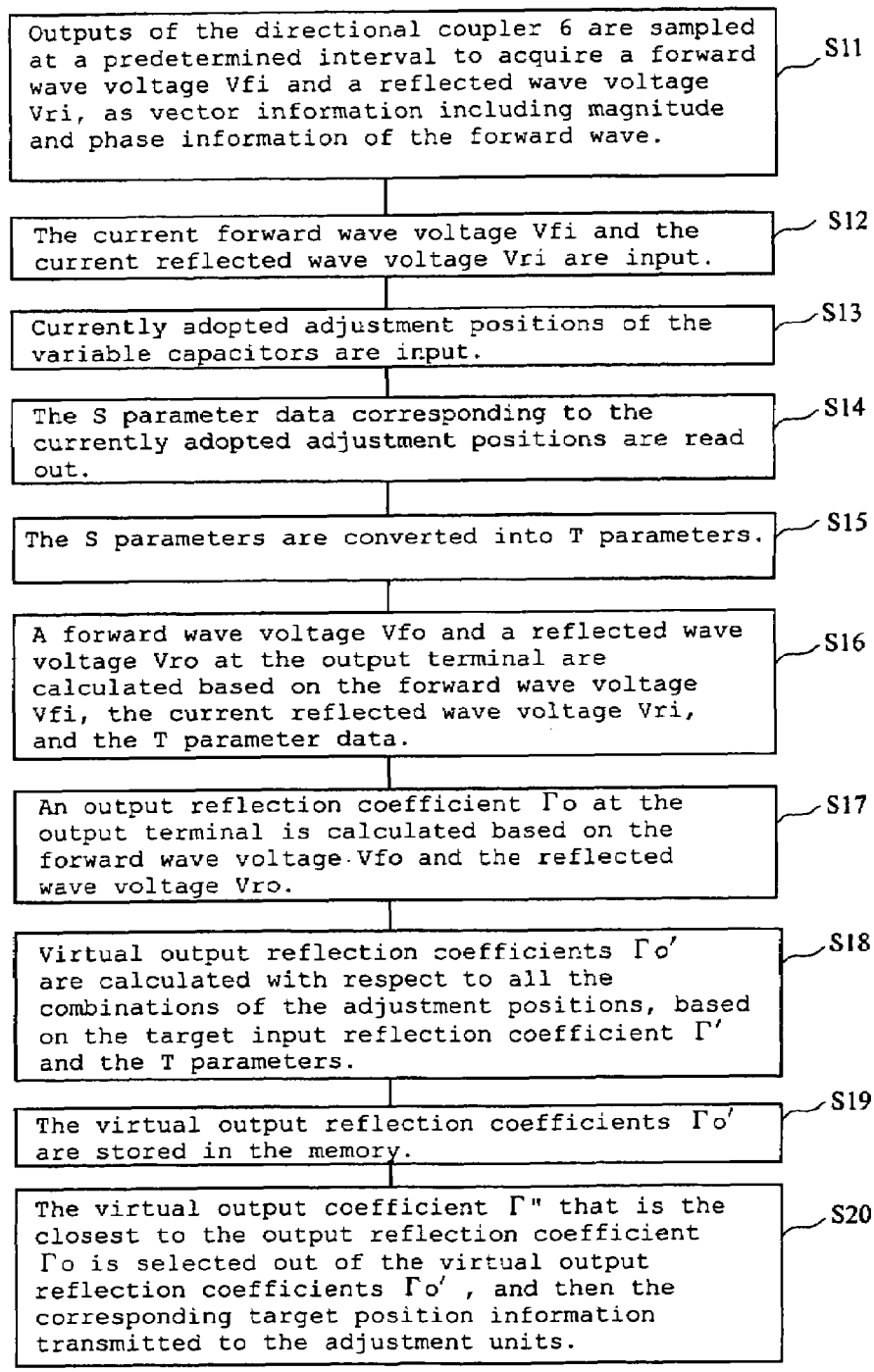
FIG. 8 is a flowchart showing an operating process of the impedance matching apparatus according to the second embodiment.

Hereunder, description will be given on an operation of the impedance matching apparatus 3, referring to FIG. 7 showing the functional block of the control unit 9A and to FIG. 8 showing a flowchart. The control unit 9A according to the second embodiment includes a vectorization unit 21, a forward wave/reflected wave calculator 22, a first T parameter lookup unit 23, an output reflection coefficient calculator 31, a second T parameter lookup unit 25, a virtual output reflection coefficient calculator 32, a memory 33, and a reflection coefficient identifier 34. Among the constituents, those of the same numeral as the first embodiment have the identical functions. The remaining portion of the configuration is generally similar to that of the first embodiment.

The output reflection coefficient calculator 31 serves as the third calculator according to the present invention. The section including the virtual output reflection coefficient calculator 32 and the second T parameter lookup unit 25 serves as the fourth calculator. The memory 33 serves as the third storage unit. The reflection coefficient identifier 34 serves as the second identifier.

In the second embodiment, the steps S11 to S16 shown in FIG. 8 are similar to the steps S1 to S6 in FIG. 5 showing the operation process according to the first embodiment, and hence the following passages cover the steps as from S17. The control unit 9A outputs, once the forward wave/reflected wave calculator 22 calculates the current-forward wave voltage Vfo and the current reflected wave voltage Vro at the output terminal 3b (Ref. S16 in FIG. 8), the forward wave voltage Vfo and the reflected wave voltage Vro to the output reflection coefficient calculator 31.

The output reflection coefficient calculator 31 calculates the current output reflection coefficient Γo at the output terminal 3b, based on the forward wave voltage Vfo and the reflected wave voltage Vro output from the forward wave/reflected wave calculator 22 (step S17). The output reflection coefficient Γo at the output terminal 3b can be calculated by Formula 6.

$$\Gamma_o = \frac{V_{ro}}{V_{fo}} \tag{6}$$

The output reflection coefficient Γo at the output terminal 3b calculated by the output reflection coefficient calculator 31 is output to the reflection coefficient identifier 34.

Meanwhile, the second T parameter lookup unit 25 reads out all of the S parameter data corresponding to all the combinations of the adjustment positions of the variable capacitors VC1, VC2 stored in the EEPROM 15, and converts the S parameter data to T parameters. The prepared T parameters are output to the virtual output reflection coefficient calculator 32, together with the corresponding position information (i.e. the information on the combination of the adjustment positions) of the variable capacitors VC1, VC2.

Here, if the T parameters are to be output from the second T parameter lookup unit 25 in a predetermined sequence, and the virtual output reflection coefficient calculator 32 is capable of identifying the correspondence between the set of T parameter and the position information of the variable capacitors VC1, VC2, the T parameters alone may be output without the position information of the variable capacitors VC1, VC2 corresponding to the T parameters.

Also, the T parameters may be prepared when the S parameters of the impedance matching apparatus 3 are measured before the shipment of the product, and stored in the EEPROM 15 in advance of operation.

If the T parameters are preinstalled in the EEPROM 15, the second T parameter lookup unit 25 may read out the T parameter data corresponding to all the combinations of the adjustment positions of the variable capacitors VC1, VC2 from the EEPROM 15 together with the position information (i.e. the information about the combination of the adjustment positions) of the variable capacitors VC1, VC2, and output such data to the virtual output reflection coefficient calculator 32.

Alternatively, the second T parameter lookup unit 25 may be omitted, and instead the virtual output reflection coefficient calculator 32 may be granted with a function of reading out the T parameter data corresponding to all the combinations of the adjustment positions of the variable capacitors VC1, VC2, from the EEPROM 15 together with the position information (i.e. the information on the combination of the adjustment positions) of the variable capacitors VC1, VC2.

It should be noted that the virtual output reflection coefficient calculator 32 contains a target input reflection coefficient Γ' which is preset. Normally the input reflection coefficient Γ' is set such that the amount of the reflected wave at the input terminal 3a becomes minimal. The target input reflection coefficient Γ' can be defined by Formula 7.

$$\Gamma' = \frac{Z_{in} - Z_o}{Z_{in} + Z_o} \tag{7}$$

In Formula 7, Zin denotes the target impedance which is the sum of the real part Rin and the imaginary part Xin, expressed as Zin=Rin+jXin. Zo denotes the characteristic impedance. Also, the virtual output reflection coefficient calculator 32 may preset the target impedance Zin and the characteristic impedance Zo, to thereby convert these values into the target input reflection coefficient Γ', instead of directly setting the target input reflection coefficient Γ'.

The virtual output reflection coefficient calculator 32 calculates the virtual output reflection coefficient Γo' at the output terminal 3b, based on the target input reflection coefficient Γ' thus set and the T parameters output from the second T parameter lookup unit 25 (step S18).

Specifically, the virtual output reflection coefficient Γo' can be obtained by Formula 8. The virtual output reflection coefficients Γo' are calculated with respect to the S parameters (or T parameters) corresponding to all the combinations of the adjustment positions of the variable capacitors VC1, VC2.

$$\Gamma'_o = \frac{T''_{21} + T''_{22}\Gamma'}{T''_{11} + T''_{12}\Gamma'} \qquad (8)$$

Here, $T_{11}''$, $T_{21}''$, $T_{12}''$, and $T_{22}''$ are the T parameters constituting the set corresponding to the adjustment positions of the variable capacitors VC1, VC2.

Formula 8 can be led as follows. The virtual output reflection coefficient Γo' can be obtained by dividing the reflected wave voltage Vro at the output terminal by the forward wave voltage Vfo, i.e. by the formula of Γo'=Vro/Vfo. The reflected wave and the forward wave voltages Vro, Vfo can be defined as Vfo=$T_{11}''$·Vfi+$T_{12}''$·Vri and Vro=$T_{21}''$·Vfi+$T_{22}''$·Vri respectively, based on Formula 3 and taking the T parameters into account. (Vfi and Vri are the forward wave voltage and the reflected wave voltage at the output terminal 3b.) The above leads to Γo'=($T_{21}''$·Vfi+$T_{22}''$·Vri)/($T_{11}''$·Vfi+$T_{12}''$·Vri). Now, since the input reflection coefficient Γ' is defined as Γ'=Vri/Vfi, the formula of Γo'={$T_{21}''$·Vfi+$T_{22}''$·(Γ'·Vfi)}/{$T_{11}''$·Vfi+$T_{12}''$·(Γ'·Vfi)}=($T_{21}''$+$T_{22}''$·Γ')/($T_{11}''$+$T_{12}''$·Γ') can be established.

The virtual output reflection coefficients Γo' with respect to all the combinations of the adjustment positions of the variable capacitors VC1, VC2, calculated by the virtual output reflection coefficient calculator 32, are sequentially output to the memory 33 together with the corresponding position information (i.e. the information on the combination of the adjustment positions) of the variable capacitors VC1, VC2, to be temporarily stored in the memory 33 (step S19).

Here, if the virtual input reflection coefficients Γo' are to be output from the virtual output reflection coefficient calculator 32 in a predetermined sequence and at the memory 33 is capable the identification of the correspondence between the virtual output reflection coefficient Γo' and the position information of the variable capacitors VC1, VC2, the virtual output reflection coefficients Γo' alone may be output without the position information of the variable capacitors VC1, VC2 corresponding to the virtual output reflection coefficients Γo'.

The reflection coefficient identifier 34 selects the virtual output reflection coefficient Γo'' that is the closest to the output reflection coefficient Γo at the output terminal 3b output from the output reflection coefficient calculator 31, out of the virtual output reflection coefficients Γo' corresponding to all the combinations of the adjustment positions of the variable capacitors VC1, VC2, calculated by the virtual output reflection coefficient calculator 32 and stored in the memory 33.

Figure 9:
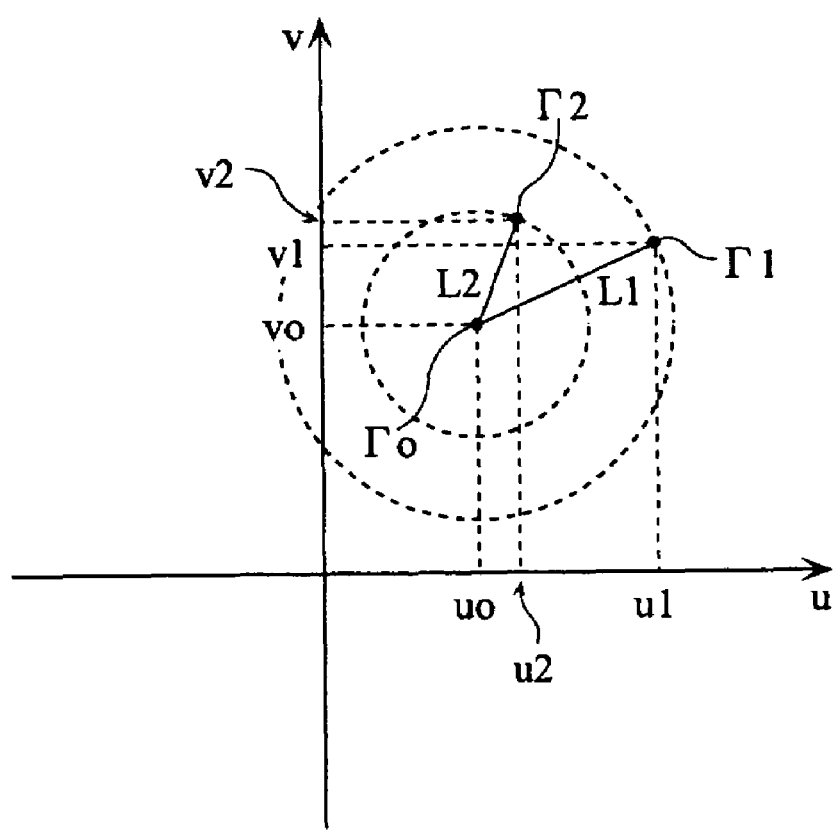
FIG. 9 is a graph showing UV coordinates for selecting a reflection coefficient closest to the output reflection coefficient.
Figure 10:
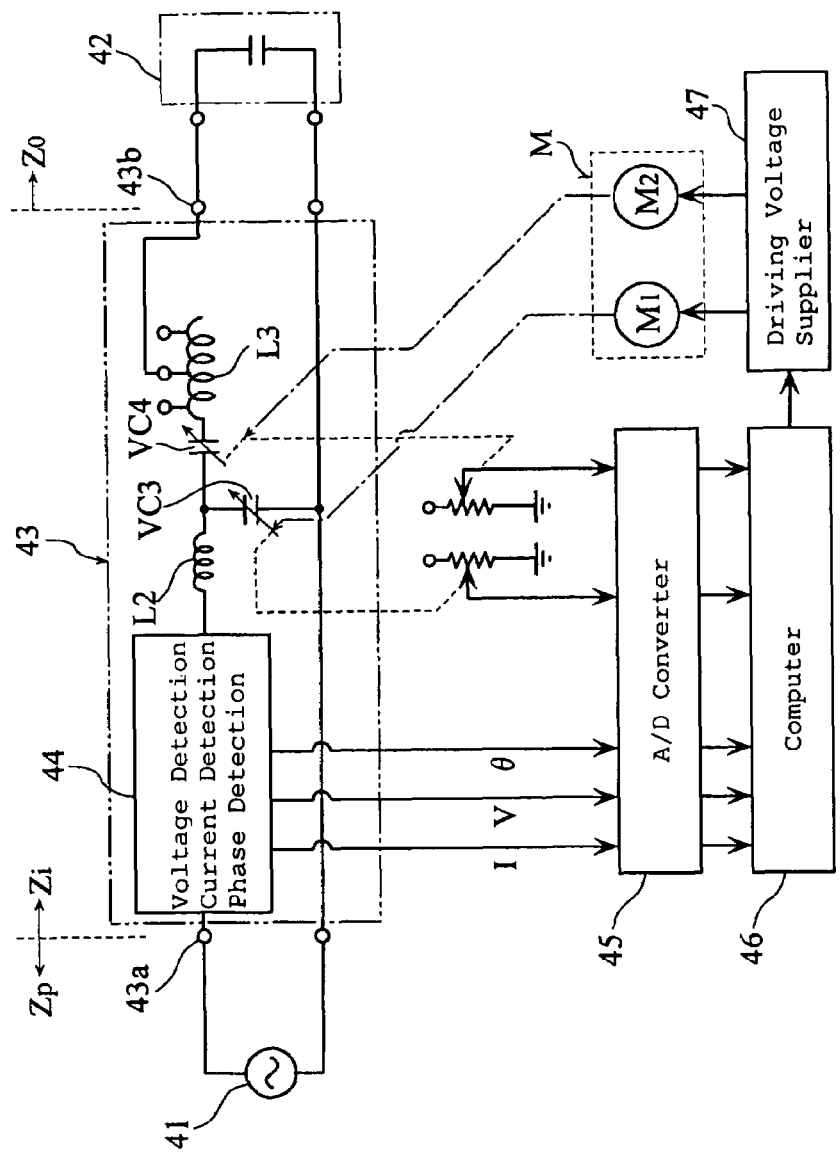
FIG. 10 is a block diagram showing a configuration of a high-frequency power supply system including a conventional impedance matching apparatus.

For example, a reflection coefficient can be expressed as the sum of a real part and an imaginary part (Γ=u+jv, where u is the real part and v is the imaginary part), and hence distances between the reflection coefficients on the uv coordinates can be easily obtained. Specifically, when the output reflection coefficient Γo is defined by uo+jvo, and the virtual output reflection coefficient Γ1 is defined by u1+jv1 as shown in FIG. 9, the distance between these reflection coefficients L1 on the uv coordinates can be obtained from L1=$\sqrt{\{(uo-u1)^2+(vo-v1)^2\}}$.

Also, the distance L2 between the virtual output reflection coefficient Γ2 (u2+jv2) other than the virtual output reflection coefficient Γ1 and the output reflection coefficient Γo can be obtained from L2=$\sqrt{\{(uo-u2)^2+(vo-v2)^2\}}$. Accordingly, it is appropriate to select the virtual output reflection coefficient corresponding to the shorter distance (in this case Γ2) out of L1, L2 as the virtual output reflection coefficient Γo'' closest to the output reflection coefficient Γo.

The reflection coefficient identifier 34 then identifies as the target position the adjustment position of the variable capacitors VC1, VC2 corresponding to the selected virtual output reflection coefficient Γo''. For example, when the selected virtual output reflection coefficient Γo'' has the adjustment position on the point A in FIG. 6, the adjustment position (4, 3) of the variable capacitors VC1, VC2 is identified as the target position.

In other words, when the variable capacitors VC1, VC2 are adjusted to take the position corresponding to the virtual output reflection coefficient Γo'' closest to the output reflection coefficient Γo at the output terminal 3b, the reflection coefficient becomes closest to the preset target input reflection coefficient Γ'. Since the target input reflection coefficient Γ' is normally a minimal value i.e. zero (Γ'=0+j0 when the target input reflection coefficient Γ' is expressed as the sum of the real part and the imaginary part), adjusting the variable capacitors VC1, VC2 as above enables reducing the reflected wave at the input terminal 3a to the minimal amount when performing the impedance matching. It is a matter of course that, as is the case with the first embodiment, the target input reflection coefficient Γ' may be set at a value other than zero. Also, a setting unit that sets the target input reflection coefficient Γ' may be provided, so that the setting unit may change the target input reflection coefficient Γ' as desired.

The target position information of the variable capacitors VC1, VC2 selected by the reflection coefficient identifier 34 is transmitted to the adjustment units 11, 12 (step S20), so that the variable capacitors VC1, VC2 are displaced to the specified position. In other words, the variable capacitors VC1, VC2 are adjusted to take a position that makes the virtual input reflection coefficient Γi minimal.

As described above, according to the second embodiment the impedance matching apparatus 3 is utilized as a transmission apparatus as a whole, so as to acquire the transmission characteristic of the transmission apparatus in a form of the information on the S parameter and the T parameter with respect to the adjustable range of the variable capacitors VC1, VC2, to thereby perform the impedance matching based on such information. Such method allows performing the impedance matching with higher accuracy in comparison with the conventional impedance matching method.

Also, since the target input reflection coefficient Γ' is preset, the virtual output reflection coefficient calculator 32 only has to calculate once the virtual output reflection coefficient Γo' corresponding to all the combinations of the adjustment positions of the variable capacitors VC1, VC2, unless the target input reflection coefficient Γ' has to be modified after activating the system. The control unit 9 according to the first embodiment has to calculate in the virtual input reflection coefficient calculator 24 the forward wave voltage Vfi' and the reflected wave voltage Vri' at the input terminal 3a each time the load fluctuates, while such calculation has only to be performed once according to the second embodiment, and therefore the calculation-load can be significantly reduced.

Further, the second embodiment does not utilize the inversion matrix formula of the T parameter unlike the first embodiment 1, thus saving the memory region corresponding to the inversion matrix formula of the T parameter.

It is evident that the scope of the present invention is not limited to the foregoing embodiments. For example, while the S parameter and the T parameter are employed as the characteristic parameter for the four-terminal circuit network in the embodiments, the characteristic parameter is not limited thereto. A Z parameter or a Y parameter may be employed as the characteristic parameter, in which case such parameter may be converted to the T parameter for performing the impedance matching.

Further, while the foregoing embodiments refer to the impedance matching apparatus 3 that includes the reverse L-shaped matching circuit including the inductor L1 and the variable capacitors VC1, VC2, the configuration of the matching circuit is not limited to that employed in the embodiment, but may be of a n-shape, a T-shape, an L-shape and so forth. In addition, a variable inductor may be employed as the impedance variable device, instead of the variable capacitor.

Although the present invention has been described as above, it is apparent to those skilled in the art that various modifications may be made without departing from the spirit and scope of the present invention, and that such modifications are included in the appended claims.

The invention claimed is:

1. An impedance matching apparatus to be interposed between a high-frequency power source and a load, for changing impedances of impedance variable devices so as to match an impedance of the high-frequency power source and an impedance of the load, comprising:
    a high-frequency wave information detector to detect information on a forward wave advancing from the high-frequency power source toward the load and information on a reflected wave advancing from the load toward the high-frequency power source, at an input terminal of the impedance matching apparatus;
    a variable device information detector to detect information on variable values of the impedance variable device;
    a storage unit to store therein characteristic parameters of the impedance matching apparatus acquired through a preceding measurement, with respect to the information on the variable values of the impedance variable devices, in correlation with the information on the variable values of the impedance variable devices;
    a calculator to calculate the information on the forward wave and the information on the reflected wave at an output terminal of the impedance matching apparatus, based on the information on the variable values of the impedance variable devices detected by the variable device information detector, on the characteristic parameters stored in the storage unit, and on the information on the forward wave and the information on the reflected wave detected by the high-frequency wave information detector;
    an identifier to identify the information on the variable values of the impedance variable devices needed for realizing a desired target input reflection coefficient, based on the information on the forward wave and the information on the reflected wave at the output terminal of the impedance matching apparatus calculated by the calculator, on the desired target input reflection coefficient, and on the characteristic parameters stored in the storage unit; and
    an adjustment unit to adjust the impedances of the impedance variable devices, based on the information on the variable values of the impedance variable devices identified by the identifier.

2. The impedance matching apparatus according to claim 1, wherein the characteristic parameter is an S parameter, or a T parameter acquired through conversion from the S parameter.

3. The impedance matching apparatus according to claim 1, further comprising a setting unit to set the target input reflection coefficient.

4. The impedance matching apparatus according to claim 3, wherein the characteristic parameter is an S parameter, or a T parameter acquired through conversion from the S parameter.

* * * * *